United States Patent [19]

Kaschte

[11] 4,320,363
[45] Mar. 16, 1982

[54] MONOLITHICALLY INTEGRATED FILTER CIRCUIT

[75] Inventor: Walter Kaschte, Munich, Fed. Rep. of Germany

[73] Assignee: Siemens Aktiengesellschaft, Berlin & Munich, Fed. Rep. of Germany

[21] Appl. No.: 121,411

[22] Filed: Feb. 14, 1980

[30] Foreign Application Priority Data

Mar. 30, 1979 [DE] Fed. Rep. of Germany ....... 2912801

[51] Int. Cl.³ .................... H03H 17/06; G11C 27/00; G11C 21/00; G11C 19/28
[52] U.S. Cl. .............................. 333/165; 307/221 D; 357/24
[58] Field of Search ............................ 333/165, 166; 307/221 R, 221 C, 221 D; 328/167; 357/24; 364/862

[56] References Cited

U.S. PATENT DOCUMENTS 4,267,535   5/1981   Betzl et al. ........................... 333/165
4,268,806   5/1981   Betzl et al. ........................... 333/165

FOREIGN PATENT DOCUMENTS 2608540   3/1976   Fed. Rep. of Germany ...... 333/165
2453669  12/1976   Fed. Rep. of Germany .
2555835  11/1978   Fed. Rep. of Germany .

OTHER PUBLICATIONS

Sequin et al., "Charge Transfer Devices", Academic Press, Inc., New York, 1975; pp. 1-17, 48-59, and 243-245.

Primary Examiner—Marvin L. Nussbaum
Attorney, Agent, or Firm—Hill, Van Santen, Steadman, Chiara & Simpson

[57] ABSTRACT

A monolithically integrated filter circuit having low transmission losses and a high upper cutoff frequency has at least one charged transfer device with a closed loop transmission channel provided on a doped semiconductor body to which transmission channels of branch charge transfer devices are connected at predetermined nodal points. Each charge transfer device has shift electrodes arranged over an insulating layer over a limiting surface of the semiconductor body which are charged with clock voltages. Shift electrodes in the immediate proximity of a nodal point are charged with the same clock voltage but are separately allocated to different transmission channels and have a pre-determined surface area ratio with regard to each other and the sum of their surface areas is equal to the surface area of an adjacent shift electrode which is allocated to the closed loop transmission channel. The transmission channel of a branch charge transfer device at a nodal point is disposed at an angle with respect to the transmission direction of the closed loop transmission channel which is approximately 45°.

9 Claims, 5 Drawing Figures

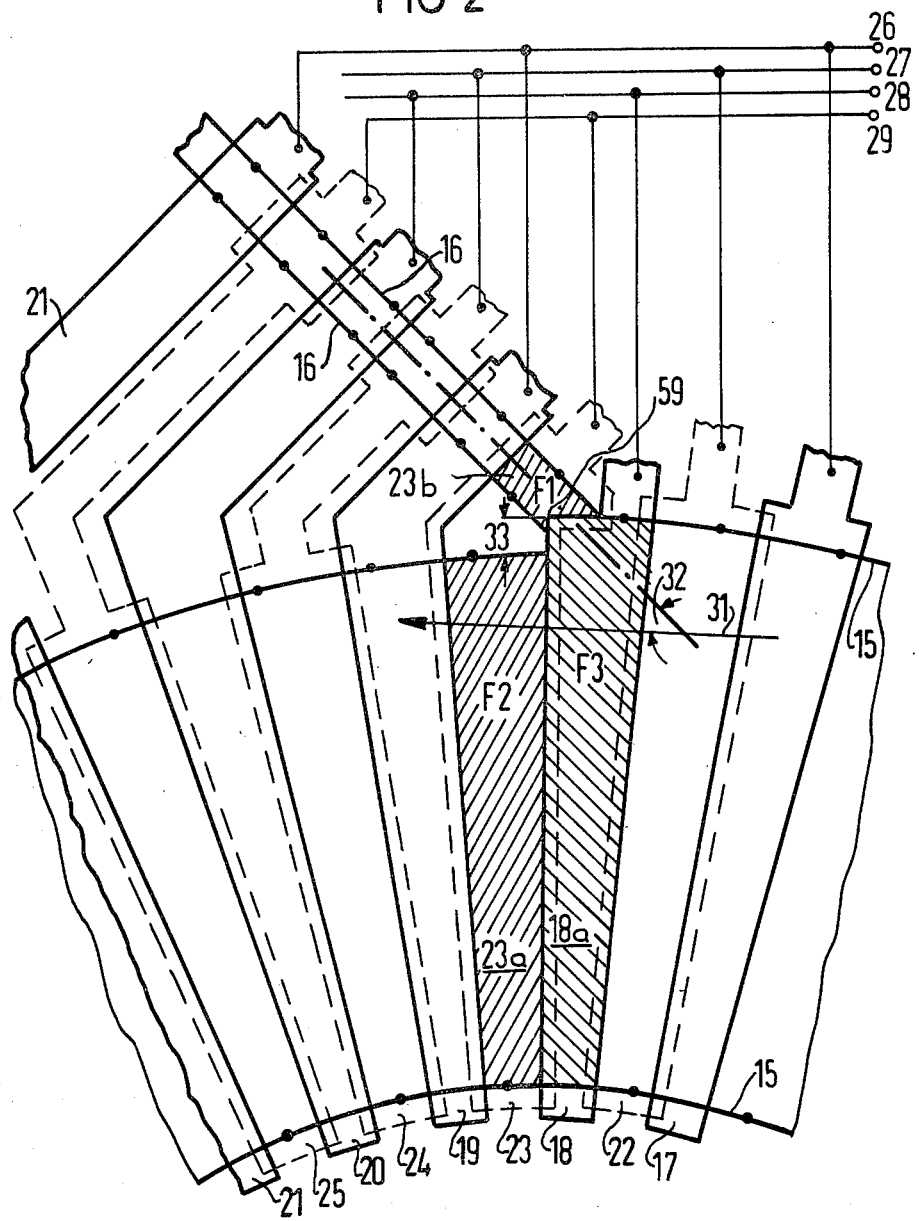

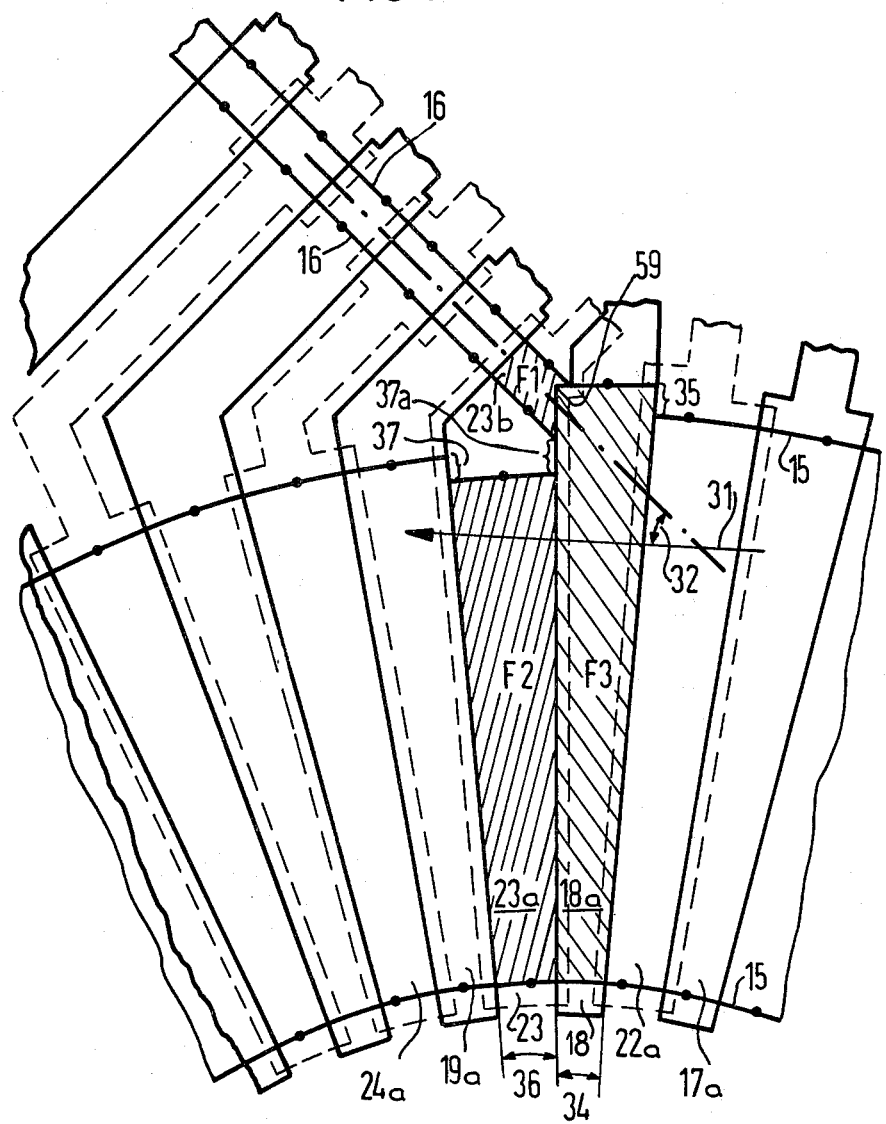

MONOLITHICALLY INTEGRATED FILTER CIRCUIT

BACKGROUND OF THE INVENTION

1. Field of the Invention

The present invention relates to monolithically integrated filter circuits, and in particular to such circuits utilizing a self-contained-channel charge transfer device arranged in a closed loop configuration to which transmission channels of other charge transfer devices are connected.

2. Description of the Prior Art

Filter circuits utilizing charge transfer devices for the attenuation of specific frequency ranges are known in the art. Such circuits have the advantage of being relatively easy to manufacture in known monolithic integration processes as opposed to other types of filter circuits utilizing capacitive or inductive values. A charge transfer device filter being arranged in a closed loop configuration, i.e. having a closed loop transmission channel, is essentially a resonator having a resonant behavior which is determined by the channel length of the closed loop transmission channel, on the number and surface area of the shift electrodes of the device, and upon the clock frequency which is used to charge the device. By selectively cooperatively adjusting the above parameters, signals within pre-determined frequency ranges can be transmitted substantially without attenuation, whereas signals outside of the selected frequency range are almost completely suppressed.

A monolithically integrated filter circuit utilizing charge transfer devices is described in German Pat. No. 2,555,835 in which the closed loop transmission channel of one charge transfer device is disposed approximately in the form of an annular ring to which the transmission channels of the other charge transfer devices are connected in a radial direction.

Charge transfer devices monolithically integrated on a semiconductor body, and thus adaptable for use in a filter circuit of the above-described type, are described in general in the publication "Charge Transfer Devices" by Sequin & Tompsett, Academic Press, Inc., New York, 1975 at pages 1 through 18. In pages 48 through 50 of the above publication, operation of such devices is described in which an input signal is supplied to a zone which is sometimes referred to as the input diode, which is doped oppositely to the semiconductor body. The input signal may alternatively be supplied to an input gate which is arranged over an insulating layer which in turn is disposed above a limiting surface of the semiconductor body. Each device comprises a number of shift electrodes which are supplied with clock voltages which are phase-displaced with respect to each other. Under some conditions, such clock voltages may also be supplied to the input gate or the input diode to effect the re-shaping of the input signal into a periodic sequence of charge packets which are subsequently moved in the transmission direction in a step-by-step manner in the semiconductor body beneath the shift electrodes. An output stage is generally situated at a designated portion of the charge transfer device which accepts the charge packets in succession and converts them into electronic output signals at an output terminal. Output stages of this type are presented and described in the above publication at pages 52 through 58.

It is further known in the art to arrange two charge transfer devices adjacent each other on one semiconductor body and to operate the devices in such a manner that the charge packets shifted in one of the devices are transferred from the region beneath a designated shift electrode of the first device into a region beneath a shift electrode of the second device and are further transmitted in the second device. Examples of operation of two or more charge transfer devices in this manner are found in the above publication on pages 243–244 as well as in German Pat. Nos. 2,555,835 and 2,453,669.

While filter circuits of the above-described type exhibit satisfactory transmission losses, it is nonetheless a problem in the art to reduce transmission losses in such filter circuits, as well as simultaneously adapting the filter circuits for use with high frequency signals by increasing the upper cutoff frequency of the filter as high as possible.

SUMMARY OF THE INVENTION

It is an object of the present invention to reduce transmission losses in monolithically integrated filter circuits which utilize charge transfer devices and at the same time to provide such a filter circuit with a high upper cut off frequency.

The above object is achieved in accordance with the principles of the present invention by connecting at least two branch charge transfer devices to a first charge transfer device arranged in a loop configuration which has a closed loop transmission channel, the transmission channel of the branch charge transfer devices being disposed at an optimum angle with respect to the closed loop transmission channel.

Each of the branch charge transfer devices has a shift electrode arranged in the immediate proximity of a nodal point connecting the transmission channel thereof to the closed loop transmission channel, said electrode being charged with the same clock voltage as a shift electrode of the first charge transfer device being arranged in the immediate proximity of the nodal point. These shift electrodes have a pre-selected surface area ratio and the sum of the areas of the two shift electrodes is equal to the surface area of a shift electrode of the first charge transfer device which is arranged at said nodal point, and which is called a nodal electrode for the purposes of the following description.

The transmission channel of each of the branch charge transfer devices is further arranged with its entire width in the region of the outer edge of the nodal electrode. In one embodiment of the invention, the nodal electrode is narrower than surrounding electrodes, but is slightly elongated to preserve the prescribed surface area ratios.

BRIEF DESCRIPTION OF THE DRAWINGS

FIG. 2 is an enlarged plan view of a transmission channel arrangement for use in the device shown in FIG. 1 constructed in accordance with the principles of the present invention.

FIG. 4 is a second embodiment of the arrangement of FIG. 2 wherein one of the shift electrodes is extended to accommodate the entire width of the transmission channel.

DESCRIPTION OF THE PREFERRED EMBODIMENTS

Figure 1:
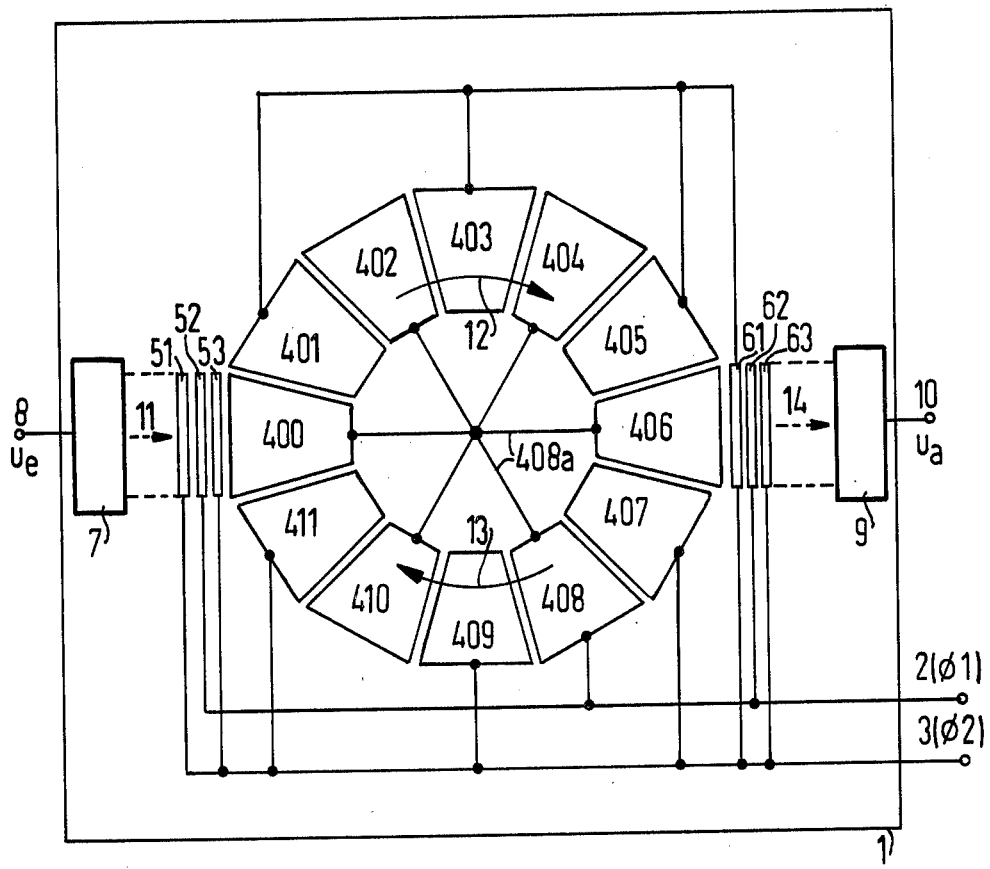
FIG. 1 is a schematic illustration of a monolithically integrated filter circuit utilizing charge transfer devices which is known in the art.

A monolithically integrated filter circuit utilizing charge transfer devices of the type which is known from German Pat. No. 2,555,835 is shown in FIG. 1. The circuit is integrated on a doped semiconductor body 1 having a limiting surface which is covered by an electrically insulating layer. Shift electrodes for the charge transfer devices consisting of electrically conductive material are applied over the insulating layer with each of the shift electrodes being connected to one of two terminals 2 or 3.

In the embodiment shown, the shift electrodes are designed as trapezoids and arranged in an annular ring consisting of electrodes 400 through 411. These electrodes form a first charge transfer device with a self-contained transmission channel which proceeds beneath the electrodes in a region of the semiconductor body 1 adjacent to the limiting surface. In FIG. 1, the lateral limitations of the channel coincide with the outer and inner radial dimensions of the electrodes 400 through 411.

The transmission channel of a second charge transfer device whose electrodes are partially illustrated and referenced at 51, 52 and 53 discharge in a radial direction into the annular channel in the region of the electrode 400, while the transmission channel of a third charge transfer device whose electrodes are partially illustrated and referenced at 61, 62 and 63 exits from the annular channel in the region of the electrode 406. The second charge transfer device is equipped with an input stage 7 to which an input signal $u_e$ is supplied at a terminal 8. The third charge transfer device has an output stage 9 from which an output signal $u_a$ is transmitted to an output terminal 10.

The electrodes 52, 62 and 408 are directly connected to the terminal 2 at which a first clock voltage $\phi 1$ is supplied. Electrodes 400, 402, 404, 406 and 410 are also connected to terminal 2 through the electrode 408 and lines 408a. The remaining electrodes 51, 53, 401, 403, 405, 407, 409, 411, 61 and 63 are connected to terminal 3 at which a second clock voltage $\phi 2$ is supplied.

By the application of voltages $\phi 1$ and $\phi 2$ at the terminals 2 and 3, the input signal $u_e$ is converted in the input stage 7 into a series of charge packets which are moved in the transmission direction 11 of the second charge transfer device and finally arrive beneath the electrode 400. The packets are subsequently transmitted in the annular channel in the transmission direction indicated by the arrows 12 and 13 and to the extent that if the input signal $u_e$ is within a prescribed frequency range the charge packets are coupled out of the annular channel at the third charge transfer device and are transmitted to the output stage 9 in the direction of the arrow 14 wherein the packets are converted into an output signal $u_a$ in the output stage 9.

In the arrangement shown in FIG. 1, best results are achieved when the sum of the surface areas of the electrodes 53 and 411 is equal to the surface area of the electrode 400. Electrodes 401 through 406 have a surface area equal to that of the electrode 401, and electrodes 407 through 410 have a surface area equal to the surface area of the electrode 411. The sum of the surface areas of the electrodes 407 and 61 is equal to the surface area of the electrode 406. The ratio of the surface area of the electrode 411 to that of the electrode 53 and the ratio of the surface area of electrode 407 to that of the electrode 61 correspond to a predetermined value which determines the resonant behavior of the filter, and thus the frequency range which may be transmitted. Each electrode will have a capacitance which is directly proportional to the area of the electrode and if $C_1$ represents the capacitance of electrodes 53 and 61, and $C_2$ represents the capacitance of electrodes 400 through 406, the band width of the filter of FIG. 1 is given in the approximation $$B \approx \frac{\frac{C_1}{C_2} + \epsilon}{\pi \sqrt{1 - \frac{C_1}{C_2} - \epsilon}}$$

wherein epsilon equals the product of the attenuation of one element and the number of such elements.

An enlarged view of a branching arrangement for a charge transfer device transmission channel from a closed loop charge transfer device transmission channel useable in the circuit shown in FIG. 1 is schematically illustrated in FIG. 2. The portion of the circuit represented in FIG. 2 corresponds approximately to that portion of the circuit in FIG. 1 in the region of the electrodes 406 and 61. In FIG. 2, the lateral limitations of the transmission channels are identified by means of lines 15 and 16 having dots. Lines 15 are circular arcs which are the annular limits of the closed loop transmission channel whereas the branching transmission channel is limited as indicated by the straight lines 16. The electrically insulating layer covering the semiconductor body 1 is a thin, film layer within the areas bounded by the lines 15 and 16 and is a thick-film layer beyond those lines. If the semiconductor body 1 consists, for example, of p-doped silicon and the insulating layer is formed of silicon dioxide, the thin and thick film regions may be respectively designated as gate oxide and field oxide regions.

A series of conductive coatings 17 through 21 are represented by solid lines in FIG. 2 and are arranged on the insulating layer covering the semiconductor body 1. The coatings 19, 20 and 21 are disposed above both of the transmission channels 15 and 16, whereas the coatings 17 and 18 are disposed only above the annular closed loop transmission channel 15. Further conductive coatings 22 through 25, which are illustrated in FIG. 2 by means of dashed lines, are located between the coatings 17 through 21 and are separated therefrom by an additional insulating layer. Parts of these coatings, which are arranged above one of the channels 15 and 16 serve as shift electrodes for one of the allocated charge transfer devices.

The coatings 17, 19 and 21 are connected via feeder lines to a terminal 26 which is charged with a first clock voltage, coatings 22 and 24 are connected to a terminal 27 to which a second clock voltage is supplied, coatings 18 and 20 are connected to a terminal 28 which is charged with a third clock voltage, and coatings 23 and 25 are charged with a fourth clock voltage received from a terminal 29. Those parts of coatings 17–25 which are respectively disposed above the channel 15 form the shift electrodes for that channel, while the portions of the coatings 19 through 21 and 23 through 25 which are arranged above the channel 16 form the shift electrodes for that channel. In FIG. 2, for example, that portion of the coating 23 which is disposed above the channel 15 is referenced at 23a, whereas the portion of the same coating disposed above the channel 16 is similarly shaded and is referenced at 23b. The portion of the coating 18 disposed above the channel 15 is referenced at 18a and is shaded in the opposite direction.

Figure 3:
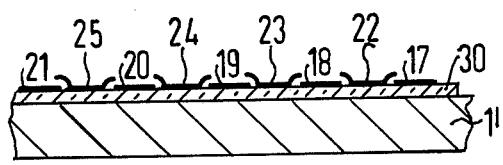
FIG. 3 is a sectional view taken along the arc 15 of FIG. 2.

A cross-section of the arrangement of FIG. 2 is shown in FIG. 3 taken along the inner arc 15 of FIG. 2. The semiconductor body in the particular embodiment of FIGS. 2 and 3 is referenced at 1', and it can be seen that the electrodes formed by the coatings exhibit an equal width. Only the marginal areas of the coatings 22 through 25 slightly overlap the marginal areas of the coatings 17 through 21, so that the smallest possible gaps result between the individual shift electrodes. The gate oxide region lying beneath the coatings is referenced at 30. The coatings 17 through 21 may consist, for example, of highly doped polycrystalline silicon, whereas the coatings 22 through 25 may consist, for example, of the same material or of aluminum.

As controlled by the four phase-shifted clock voltages appearing at the terminals 26, 27, 28 and 29, the charge packets in the two charge transfer devices shown in FIG. 2 are transmitted through the closed loop channel 15 in a step-by-step manner from right to left. In the region of electrode 18a, and therefore also at the nodal point where the channels 15 and 16 meet, the transmission direction in the closed loop channel 15 is indicated by the arrow 31. The branching channel 16 is disposed with respect to the arrow 31 at an angle 32 which is less than 90° but which is large enough such that the channel 16 discharges with its entire width into the channel 15 under the marginal area of electrode 18a. This marginal area consists of a circular arc which limits the closed loop channel 15 in a radial direction and of a part of the electrode 18a referenced at 33 which corresponds to the difference in the radial dimensions of the adjacent electrodes 18a and 23a. This difference is derived from the requirement that the sum of the respective surfaces F2 and F1 of the electrode 23a, allocated to the closed loop transmission channel 15, and 23b, allocated to the branching channel 16, must equal the surface F3 of the electrode 18a allocated to the closed loop channel 15.

As can be determined from observation of FIG. 2, a gradual reduction of the angle 32 would finally result in the channel 16 no longer discharging with its full width into the channel 15 exclusively below the marginal area of the electrode 18a. Thus a technologically conditioned minimum interval must be retained between the boundaries or limitations of the channels 15 and 16 in the region of the portion designated at 33. It is to be avoided that any portion of the channel 16 branch off beneath the electrode portion 23a, as this substantially diminishes the attenuation of the circuit.

If, on the other hand, the angle 32 is approximately 90°, then transmission of charge packets from the closed loop channel 15 into the branching channel 16 would be significantly slower and would involve significantly higher loss than the optimum embodiment shown in FIG. 2 wherein the angle 32 is approximately 45°. Deviation on either side of 45° can be undertaken according to individual requirements. Further, when the angle 32 is 45°, the ratio of the areas F2 to F1 which determines the frequency behavior of the circuit can be relatively easily calculated.

The portion of the circuit of FIG. 1 in the region of electrodes 61 and 406 can be easily modified by the inventive concept disclosed in FIG. 2 with the addition of two more terminals to accommodate the extra two phase-shifted clock voltages. On the other hand, the portion of the circuit of FIG. 1 in the region of electrodes 53 and 400 can be modified by the inventive concept of FIG. 2 in much the same way. In this case the phase-shifted clock voltages connected to the terminals 26 and 29 are substituted by one another, and so are the voltages connected to terminals 27 and 28, which will then result in a transmission direction in the channel 15 from left to right, with the charge packets moved in the channel 16 from left to right entering the channel 15 at the nodal point.

A further embodiment of a branching arrangement of a transmission channel 16 to a closed loop transmission channel 15 is shown in FIG. 4, wherein elements common to FIG. 2 have been identically referenced. In the embodiment of FIG. 4, the electrode 18a is a narrower sector of a circle than as shown in FIG. 2, with the interior arc length represented at 34. In order to retain the identical surface area F3 as in FIG. 2, the outer radius of the electrode 18a is extended by an amount referenced at 35. In contrast, the diminished width of the electrode 18a is compensated for by an increase in the arc width of the electrode 23a, which now has an enlarged arc width referenced at 36. The surface area F2 of the electrode 23a is unchanged, however, by a reduction in the outer radius of the electrode 23a by an amount referenced at 37. The remaining electrodes are not affected by these changes. The increase 35 of the electrode 18a in combination with the decrease 37 of the electrode 23a results in an increased portion of the marginal area beneath the electrode 18a at which the channel 16 can be accommodated at an angle 32 even when the difference of the outer radii of the electrodes 19a and 22a is very small. Moreover, the angle 32 can be decreased to a greater extent without resulting in overlap of the electrode 23a with the channel 16 than is possible with the configuration of FIG. 2.

In the embodiment of FIG. 4 the ratio of the surface area F2 to the surface F1 can be of a much higher value than in the embodiment of FIG. 2.

The design of the circuit is selected with particular advantage with regard to the coupling-in or coupling-out region of the channel 16 in such a manner that in the area of the outer edge of the electrode 23a a technologically conditioned minimum interval, referenced at 37a, of the channel limits is first fixed and the channel 16 is then arranged while retaining this minimum interval at such an angle 32 with respect to the transmission direction 31 that it lies with its entire width beneath the outer margin of the electrode 18a, yet does not approach the electrode portion 22a too closely. It is thus essential that the left outer corner, as shown in FIG. 4, of the electrode 18a is in the immediate coupling-in or coupling-out region of the channel 16. In such an embodiment, there is the further advantage that a ridge-like thick-film area of the insulating layer covering the semiconductor body 1' and separating the electrodes 23a and 23b remains between the channels 15 and 16 beneath the coating 23, with the projecting edges of the area exhibiting a right angle and an obtuse angle. It is possible to arrange the channel 16 in such a manner that it discharges into the self-contained channel 15 only beneath that edge of the electrode 18a proceeding approximately in the direction of the arrow 31 with the left outer corner of the electrode 18a no longer being in the coupling-in or coupling-out region of the channel 16. A ridge-like thick-film region would still remain between the channels 15 and 16, with this ridge-like region terminating in an acute angle. This arrangement, however, would require extremely precise precisioning in the manufacture thereof, consequently resulting in increased costs.

Figure 5:
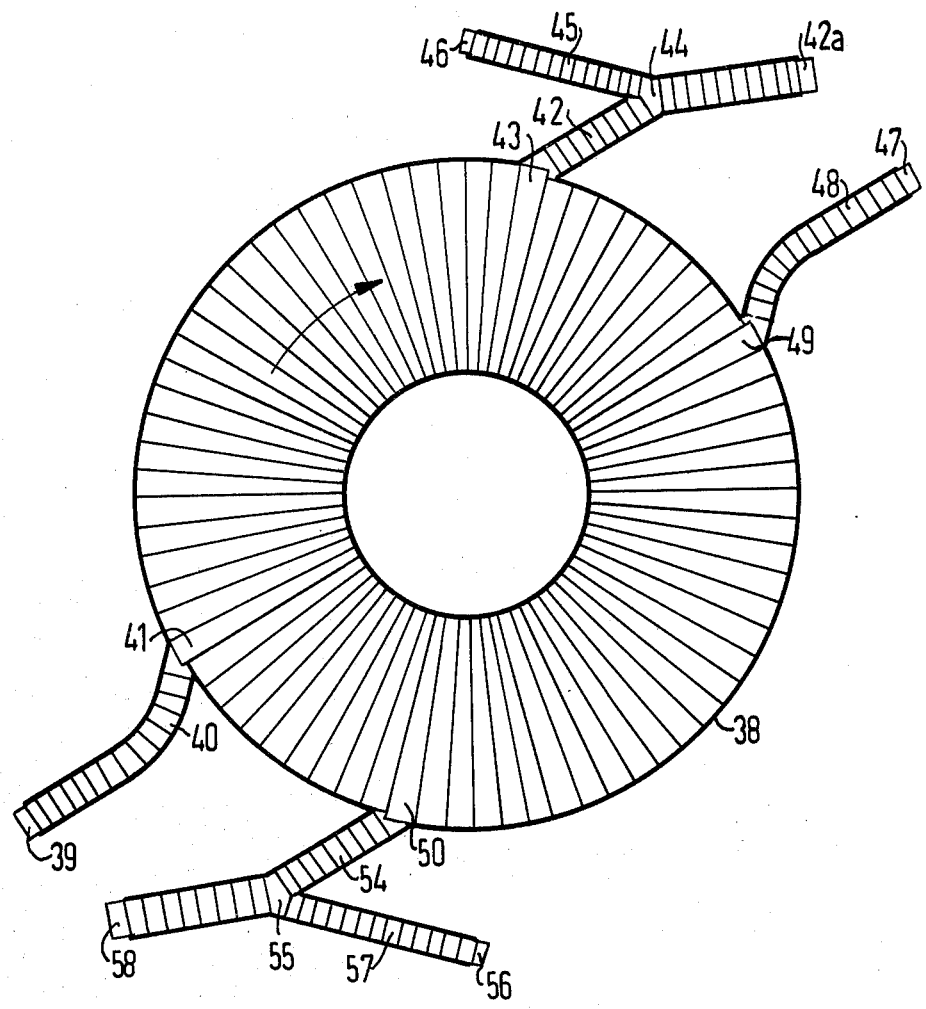
FIG. 5 is a schematic view of an entire filter circuit designed in accordance with the principles of the present invention.

A complete monolithically integrated filter circuit having transmission channels branching therefrom according to the present invention is schematically illustrated in FIG. 5. The closed loop transmission channel is designated at 38 and is composed of a segmented annular ring. The transmission direction proceeds clockwise in the direction of the arrow. A charge transfer device 40 provided with an input stage 39 discharges with its channel into the closed loop channel 38 beneath an electrode 41. A charge transfer device 42 branches off with its transmission channel from the self-contained channel 38 beneath an electrode 43. The transmission channel 45 of a further charge transfer device which is equipped with an input stage 46 discharges into the channel of the device 42 beneath an electrode 44. Signals received in the input stage 46 are converted into charge packets and are shifted step-by-step in the channel 45 and, beneath the electrode 44, are added to the charge packets transmitted through the device 42 and coupled out of the channel 38. The charge transfer device 42 has an output stage 42a.

Charge packets are introduced into the channel 38 beneath an electrode 49 from another charge transfer device 48 having an input stage 47, and a transmission channel 54 further branches off from the closed loop channel 38 beneath an electrode 50, with the channel 54 uniting at an electrode 55 with a transmission channel of a device 57 which has an input stage 56. The output stage of the charge transfer device associated with the channel 54 is referenced at 58.

As can be seen from FIG. 5, the further charge transfer devices 40, 42, 48 and 54 whose channels discharge into the closed loop channel 38 or branch off therefrom can exhibit a straight or curved configuration without the functioning of the arrangement being altered or impaired. Moreover, arrangements which are designed in accord with FIG. 5 can be interconnected with similarly designed arrangements on one semiconductor substrate or on different semiconductor substrates, whereby the output stage 42a is connected to an input stage of the next-successive arrangement corresponding to stage 39 and the input stage 47 is connected to an output stage of this arrangement corresponding to the stage 58.

Alternatively, the input stage 39 may be connected to an output stage of a preceding arrangement corresponding to stage 42a with the output stage 58 connected to a stage of the preceding arrangement corresponding to stage 47. By means of a graduation of the transmission band widths of the individual circuit arrangements according to FIG. 5 with respect to each other, which is achieved by an appropriate dimensioning of the surface areas of the respective closed loop transmission channels and in particular by dimensioning of the inside radii of these channels, complicated frequency characteristics of the entire filter circuit can be achieved.

Although the charge transfer device arrangements of the filter circuits disclosed herein have been described as charge coupled device arrangements, other charge transfer devices may be utilized such as the so-called bucket-brigade device which differs from the charge coupled device arrangement essentially in that zones are provided in the semiconductor body arranged beneath the individual shift electrodes, said zones being offset with respect to the shift electrodes and being oppositely doped. Moreover, the charge transfer device arrangements may function in two-phase, three-phase, four-phase or polyphase operation.

Although other modifications and changes may be suggested by those skilled in the art, it is the intention of the inventor to embody within the patent warranted hereon all changes and modifications as reasonably and properly come within the scope of his contribution to the art.

I claim as my invention:

1. A filter circuit monolithically integrated on a semiconductor substrate comprising:
    a first charge transfer device having a closed loop transmission channel;
    at least two branch charge transfer devices each having a transmission channel of a pre-determined width, being respectively connected at nodal points to said first charge transfer device and being operationally connected to one input or one output of said filter circuit,
    each charge transfer device having a plurality of adjacent shift electrodes overlying their respective transmission channels and said first charge transfer device having a nodal electrode at each nodal point simultaneously overlying the transmission channel of said first charge transfer device and a branch charge transfer device to couple said transmission channels;
    said first charge transfer device and each branch charge transfer device having a further electrode, respectively adjacent said nodal electrode, said further electrodes respectively overlying the transmission channels of the charge transfer devices, the sum of the areas of said further electrodes equaling the area of said nodal electrode; and
    the transmission channel of each branch charge transfer device being disposed at an acute angle with respect to the closed loop transmission channel of said first charge transfer device which permits the entire width of said transmission channel of each branch charge transfer device to abut said nodal electrode and maintains said branch charge transfer device transmission channel a spaced distance from said further electrode which overlies said closed loop transmission channel.

2. The filter circuit of claim 1 wherein each charge transfer device is a charge coupled device.

3. The filter circuit of claim 1 wherein said first charge transfer device is comprised of adjacent electrodes which are in the form of interiorally truncated circle sectors and wherein said closed loop transmission channel is an annular ring beneath said electrodes.

4. The filter circuit of claim 3 wherein said nodal points are points on an exterior of said annular ring.

5. The filter circuit of claim 1 wherein said angle is 45°.

6. The filter circuit of claim 3 wherein said nodal electrode is radially extended a distance beyond the radial termination of the adjacent shift electrode which overlies the closed loop transmission channel to expose a corner of said nodal electrode for abutment with the entire width of the further electrode overlying the transmission channel of a branch charge transfer device, and wherein said nodal electrode is narrowed to retain a constant area.

7. The filter circuit of claim 3 wherein said further electrode overlying said closed loop transmission channel is radially decreased such that said nodal electrode extends a distance beyond a radial termination of said decreased further electrode to expose a corner of said nodal electrode for abutment with the entire width of the further electrode overlying the transmission channel of a branch charge transfer device, and wherein said decreased further electrode is widened to retain a constant area.

8. The filter circuit of claim 6 wherein coupling of said closed loop and said branch transmission channels occurs only at a marginal edge of said exposed corner of said nodal electrode.

9. The filter circuit of claim 7 wherein coupling of said closed loop and said branch transmission channels occurs only at a marginal edge of said exposed corner of said nodal electrode.

* * * * *